United States Patent
Doyle et al.

(10) Patent No.: US 8,786,040 B2
(45) Date of Patent: Jul. 22, 2014

(54) PERPENDICULAR SPIN TRANSFER TORQUE MEMORY (STTM) DEVICE HAVING OFFSET CELLS AND METHOD TO FORM SAME

(71) Applicants: Brian S. Doyle, Portland, OR (US); David L. Kencke, Beaverton, OR (US); Charles C. Kuo, Hillsboro, OR (US); Uday Shah, Portland, OR (US); Kaan Oguz, Dublin (IE); Mark L. Doczy, Portland, OR (US); Satyarth Suri, Hillsboro, OR (US); Clair Webb, Aloha, OR (US)

(72) Inventors: Brian S. Doyle, Portland, OR (US); David L. Kencke, Beaverton, OR (US); Charles C. Kuo, Hillsboro, OR (US); Uday Shah, Portland, OR (US); Kaan Oguz, Dublin (IE); Mark L. Doczy, Portland, OR (US); Satyarth Suri, Hillsboro, OR (US); Clair Webb, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/723,866

(22) Filed: Dec. 21, 2012

(65) Prior Publication Data
US 2014/0175583 A1    Jun. 26, 2014

(51) Int. Cl.
*H01L 27/22*    (2006.01)
(52) U.S. Cl.
USPC ............... 257/427; 257/295; 257/E27.006; 257/E27.104; 365/158; 365/72

(58) Field of Classification Search
USPC .............. 257/427, 295, E27.006, E27.104; 438/48; 365/158, 72
See application file for complete search history.

(56) References Cited

U.S. PATENT DOCUMENTS

| | | | |
|---|---|---|---|
| 2010/0019297 A1 | 1/2010 | Hwang | |
| 2010/0054026 A1* | 3/2010 | Xi et al. | 365/158 |
| 2010/0109110 A1* | 5/2010 | Wang et al. | 257/421 |
| 2012/0205758 A1 | 8/2012 | Jan et al. | |

FOREIGN PATENT DOCUMENTS

| | | |
|---|---|---|
| JP | 2012-064863 | 3/2012 |
| KR | 1020090105698 | 10/2009 |
| KR | 1020110000812 | 1/2011 |

OTHER PUBLICATIONS

International Search Report and Written Opinion from PCT/US2013/046197 mailed Nov. 19, 2013, 11 pgs.

* cited by examiner

*Primary Examiner* — Tu-Tu Ho
(74) *Attorney, Agent, or Firm* — Blakely, Sokoloff, Taylor & Zafman LLP

(57) ABSTRACT

Perpendicular spin transfer torque memory (STTM) devices having offset cells and methods of fabricating perpendicular STTM devices having offset cells are described. For example, a spin torque transfer memory (STTM) array includes a first load line disposed above a substrate and having only a first STTM device. The STTM array also includes a second load line disposed above the substrate, adjacent the first load line, and having only a second STTM device, the second STTM device non-co-planar with the first STTM device.

28 Claims, 11 Drawing Sheets

US 8,786,040 B2

PERPENDICULAR SPIN TRANSFER TORQUE MEMORY (STTM) DEVICE HAVING OFFSET CELLS AND METHOD TO FORM SAME

TECHNICAL FIELD

Embodiments of the invention are in the field of memory devices and, in particular, perpendicular spin transfer torque memory (STTM) devices having offset cells and methods of fabricating perpendicular STTM devices having offset cells.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current of electrons is passed through a magnetization layer, called the fixed magnetic layer, it will come out spin polarized. With the passing of each qualified electron post the tunneling process through the dielectric layer, its spin (which is referred to as "intrinsic" angular momentum of the electron) will impact the magnetization in a next magnetic layer, called the free magnetic layer, causing a small change. Through the principal of conservation of angular momentum, this results in a torque-causing precession of magnetization. Due to reflection of electrons, a torque is also exerted on the magnetization of an associated fixed magnetic layer, but this layer is pinned. In the end, if the current exceeds a certain critical value (given by damping caused by the magnetic material and its environment), the direction of the magnetization of the free magnetic layer will be switched by a pulse of current, typically in less than about 10 nanoseconds. Magnetization of the fixed magnetic layer should remain unchanged since an associated current is below its threshold due to geometry or due to an adjacent anti-ferromagnetic layer.

Spin-transfer torque can be used to flip the active elements in magnetic random access memory. Spin-transfer torque memory, or STTM, has the advantages of lower power consumption and better scalability over conventional magnetic random access memory (MRAM) which uses magnetic fields to flip the active elements. However, significant improvements are still needed in the area of STTM device manufacture and usage.

DESCRIPTION OF THE EMBODIMENTS

Perpendicular spin transfer torque memory (STTM) devices having offset cells and methods of fabricating perpendicular STTM devices with enhanced stability are described. In the following description, numerous specific details are set forth, such as specific magnetic layer integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to offset memory devices for scaling of perpendicular STTM systems. Applications may include use in embedded memory, embedded non-volatile memory (NVM), magnetic random access memory (MRAM), magnetic tunnel junction (MTJ) devices, NVM, perpendicular MTJ, STTM, and non-embedded or stand-alone memories. In an embodiment, stability in perpendicular STTM devices is achieved by vertically staggering adjacent cells in an array of STTM devices, as is described in greater detail below.

One or more embodiments are directed to approaches for preventing or mitigating "crosstalk" such as from fringing fields in STTM arrays, and, additionally, to increasing packing density for such arrays. As STTMs are scaled to smaller and smaller dimensions, the spacing between the individual memory cells is also typically scaled in lockstep. At a certain point (e.g., at a certain technology node), the spacing between cells becomes so small that the fringing magnetic fields from one memory device can influence the behavior of its neighbor, causing reduced lifetimes and increased switching current thresholds.

Figure 1A:
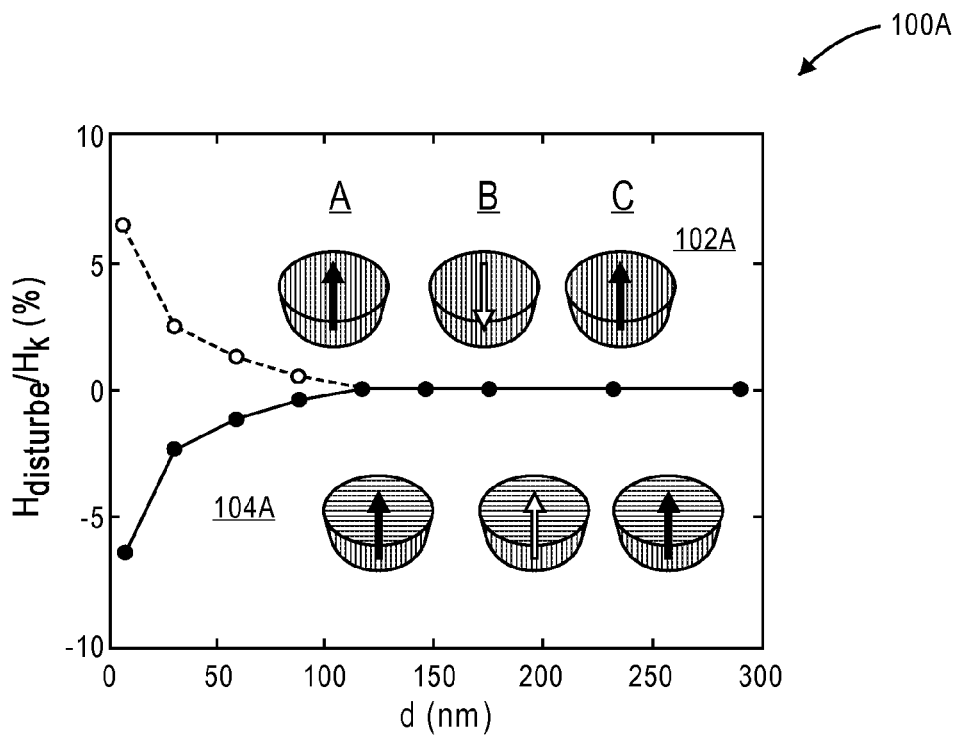
FIG. 1A is a plot showing the effect on magnetic field as a result of scaling cell proximity in STTM arrays.
Figure 1B:
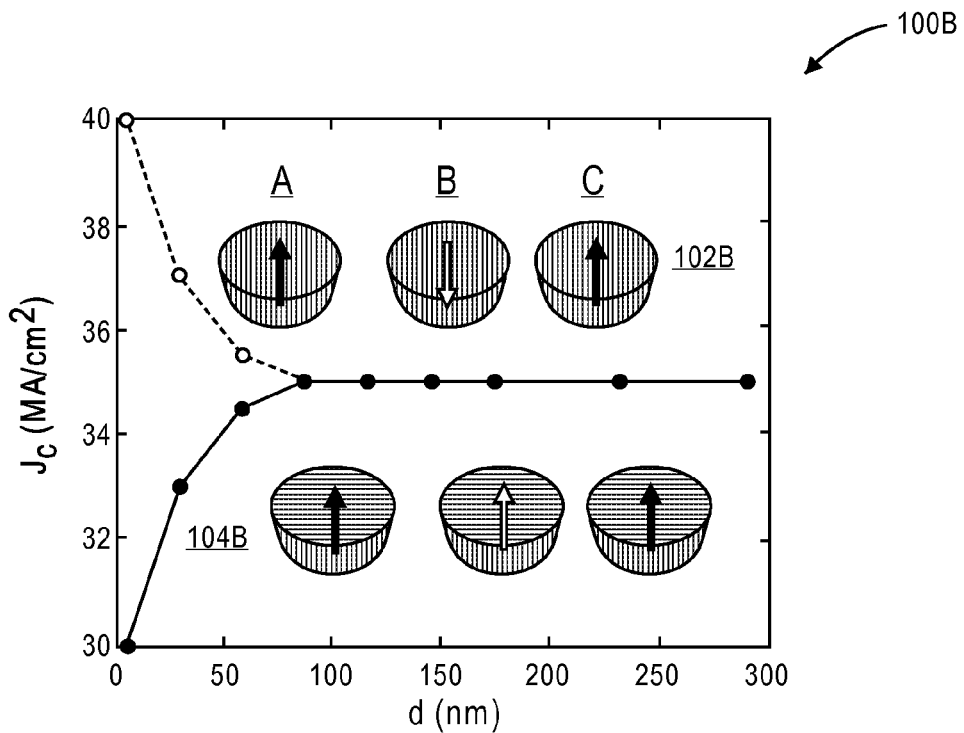
FIG. 1B is a plot showing the effect on required current as a result of scaling cell proximity in STTM arrays.

As an example, FIGS. 1A and 1B are plots 100A and 100B, respectively, showing the effects on magnetic field and required current, respectively, as a result of scaling cell proximity in STTM arrays. More specifically, plots 100A and 100B correlate magnetic filed ($H_{disturb}$; which is also an indication of the stability of the cell—the stronger Hdisturb, the more stable the cell) or required junction current (where $J_C$ is the critical current density to switch the device), respectively, as a function of cell spacing (Δd, in nanometers) for three adjacent cells. Referring to plots 100A and 100B, as Δd is decreased (from right to left), the properties of the central "victim" cell B is affected by the magnetic fields of aggressor cells A and C. If the victim cell B is aligned anti-parallel with cells A and C (as is the case of the top arrays 102A and 102B, respectively), the cell becomes harder to flip, and also harder to write to, as Δd is decreased. If the victim cell B is aligned parallel with cells A and C (as is the case of the bottom arrays 104A and 104B, respectively), the cell becomes easier to flip, and also easier to write to, as Δd is decreased, and consequently less stable.

The phenomena demonstrated in plots 100A and 100B illustrate an issue not yet addressed in the art. One approach could be to shrink the size of each memory element so that the distance between the edges of adjacent elements shrinks. However, shrinking the size also reduces the stability since stability decreases as volume of the element decreases.

Figure 2A:
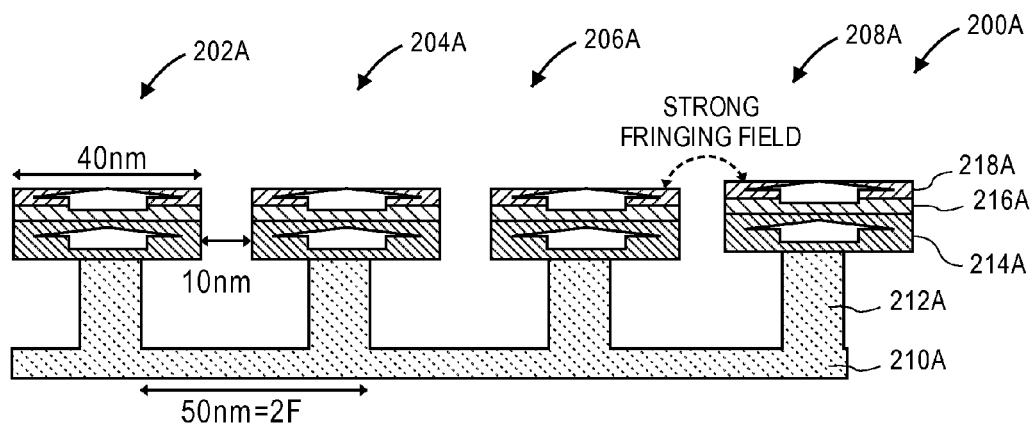
FIG. 2A illustrates a cross-sectional view of a conventional array of perpendicular STTM devices.
Figure 2B:
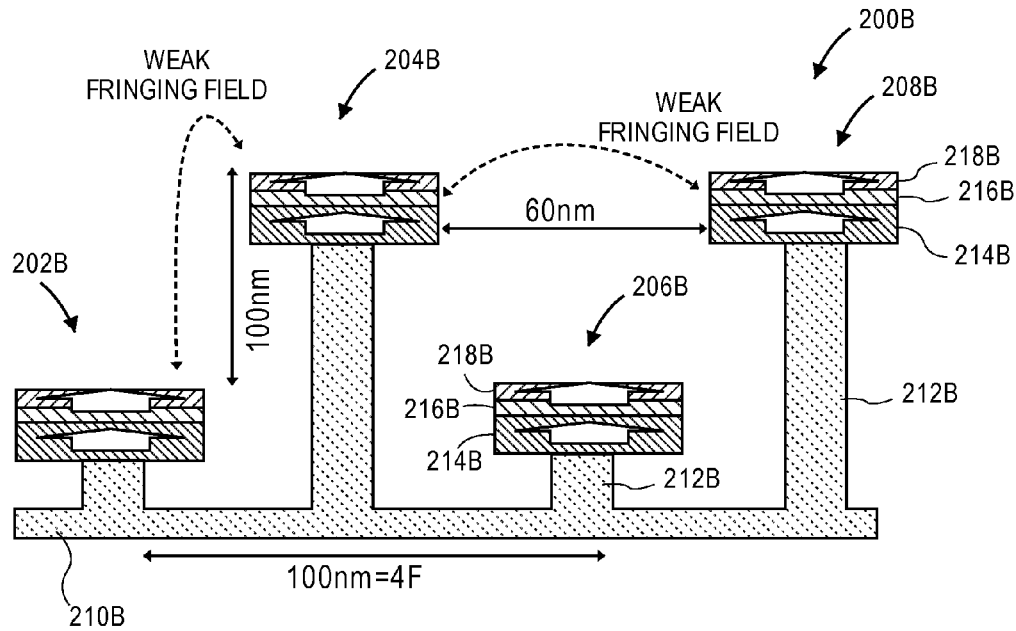
FIG. 2B illustrates a cross-sectional view of a staggered or offset array of perpendicular STTM devices, in accordance with an embodiment of the present invention.

In order to demonstrate relevant issues structurally, FIG. 2A illustrates a cross-sectional view of a conventional array of perpendicular STTM devices, while FIG. 2B illustrates a cross-sectional view of a staggered or offset array of perpendicular STTM devices, in accordance with an embodiment of the present invention.

Referring to FIG. 2A, a conventional array 200A of perpendicular STTM devices 202A, 204A, 206A and 208A, for example, is disposed above a bottom electrode 210A. The perpendicular STTM devices 202A, 204A, 206A and 208A are coupled to the bottom electrode 210A through load lines 212A (it is to be understood that although depicted as a common electrode for simplicity, it is to be understood that each device is coupled to its own corresponding transistor electrode to form a 1T-1STTM cell). Each perpendicular STTM device 202A, 204A, 206A and 208A includes a fixed magnetic layer 214A, a tunnel oxide layer 216A, and a free magnetic layer 218A. Furthermore, perpendicular STTM devices 202A, 204A, 206A and 208A are all formed in the same plane (such as in a same back-end interconnect level of an integrated circuit), with exemplary distances between devices being approximately 10 nanometers, devices widths of approximately 40 nanometers, and load line to load line distances (effectively pitch) of approximately 50 nanometers. In the arrangement 200A, a strong fringing field may interfere with the performance of adjacent devices, as is depicted in FIG. 2A, since the spacing is only approximately 10 nanometers.

By contrast, referring to FIG. 2B, an offset array 200B of perpendicular STTM devices 202B, 204B, 206B and 208B, for example, is disposed above a bottom electrode 210B. The perpendicular STTM devices 202B, 204B, 206B and 208B are coupled to the bottom electrode 210B through load lines 212B (it is to be understood that although depicted as a common electrode for simplicity, it is to be understood that each device is coupled to its own corresponding transistor electrode to form a 1T-1STTM cell). Each perpendicular STTM device 202B, 204B, 206B and 208B includes a fixed magnetic layer 214B, a tunnel oxide layer 216B, and a free magnetic layer 218B. However, different from array 200A, the perpendicular STTM devices 202B, 204B, 206B and 208B are formed in the two different planes, with adjacent devices being non-co-planar. Exemplary distances between devices for an array node comparable to 200A remains at 10 nanometers. However, with a device width of approximately 40 nanometers, the spacing between co-planar devices (e.g., 202B and 206B are co-planar, while 204B and 208B are co-planar) is approximately 60 nanometers. Exemplary load line to load line distances (effectively pitch) of co-planar devices is thus approximately 100 nanometers. In an exemplary embodiment, the height of the offset between adjacent devices is approximately 100 nanometers. In the arrangement 200B, both a fringing field between co-planar devices (e.g., between devices 204B and 208B) and a fringing field between adjacent devices (e.g., between devices 202B and 204B) may exist, as depicted in FIG. 2B. However, since the infringing fields are between offset adjacent devices or between non-adjacent co-planar devices, the fringing fields, if any, are relatively weak. Since the fringing fields are weak, instabilities and/or switching current issues may be virtually eliminated.

Furthermore, in fabricating the array 200B, lithography constraints can be reduced, as described in greater detail below in association with illustrative fabrication schemes, even though the density of the devices within the array 200B is the same as for array 200A. For example, the distance between two minimum spaced features is taken to be approximately 50 nanometers for array 200A. With a 0.7× scaling factor between generations, for the layout of the array 200B (same memory density 200A), the cells can be laid out with 2 times greater minimum feature lengths, or lithographic constraints from a technology 2 generations older. That is, array 200A requires 2F patterning while array 200B requires only 4F patterning. With the issues facing lithography, fabrication of arrays such as array 200B leads to a greatly decreased cost for this approach, despite the need to pattern on two dielectric layers, a trade-off described in greater detail below. In an embodiment, with an increase in distance between memory elements in array 200B versus 200A, it is possible to trade-off some of the distance between memory elements for greater density. That is, increasing density can be achieved by reducing feature size from 4F (e.g., process described in FIGS. 3A-3I) to 3F (e.g., process described in FIGS. 4A-4H) while maintaining a relatively large distance between memory elements (e.g., approximately 35 nanometers for an offset array versus 10 nanometer for a conventional array). Such an approach effectively increases density over co-planar arrays by 50%, while still benefiting from reduced fringing fields.

With respect to fabrication schemes, two illustrative examples are provided below. In an example using a tight lithography approach, FIGS. 3A-3I illustrate cross-sectional views of various operations in a method of fabricating an array of perpendicular STTM devices, in accordance with an embodiment of the present invention. In an example using a relaxed lithography approach, FIGS. 4A-4H illustrate cross-sectional views of various operations in another method of fabricating an array of perpendicular STTM devices, in accordance with another embodiment of the present invention. Specific materials suitable for each scheme are described below in association with FIG. 5.

Figure 3A:
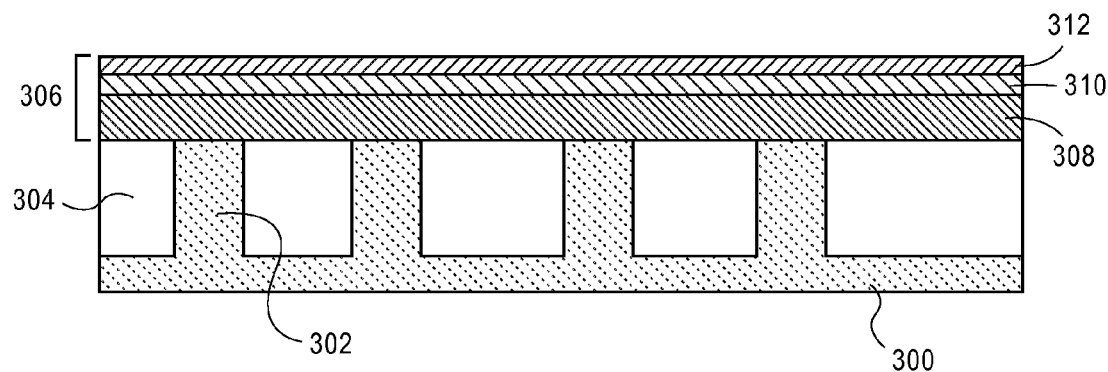
FIGS. 3A-3I illustrate cross-sectional views of various operations in a method of fabricating an array of perpendicular STTM devices, in accordance with an embodiment of the present invention.
Figure 3B:
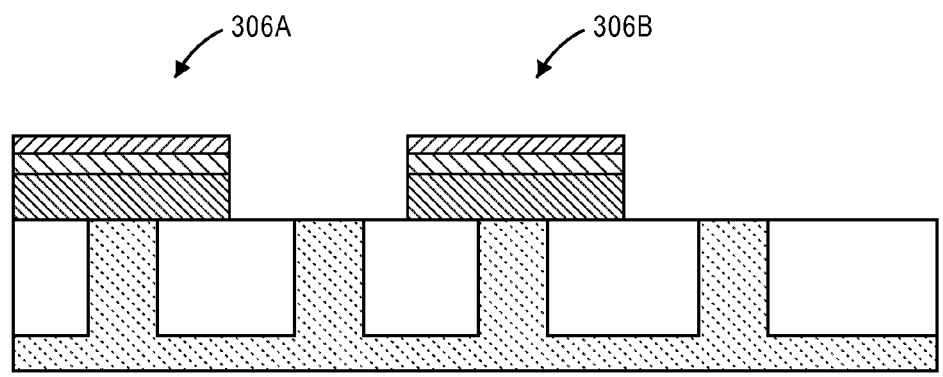
Figure 3C:
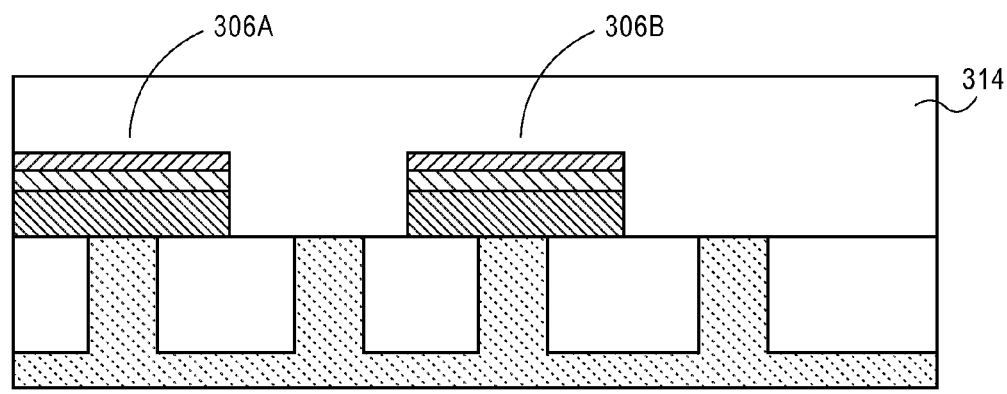

In an aggressive lithography approach, referring to FIG. 3A, a material stack 306 for forming magnetic tunnel junction (MTJ) includes a fixed magnetic layer 308, a tunnel oxide layer 310 and a free magnetic layer 312. The material stack 306 is formed above a plurality of load lines 302 formed above a bottom electrode 300 (which may be formed above a substrate, not shown; it is to be understood that although depicted as a common electrode for simplicity, it is to be understood that each device is coupled to its own corresponding transistor electrode to form a 1T-1STTM cell). An inter-dielectric layer 304 may be included between load lines 302, as depicted in FIG. 3A. Referring to FIG. 3B, the material stack 306 is patterned (e.g., by lithography and etch processing) to provide individual MTJs 306A and 306B. An additional inter-layer dielectric layer 314 is formed on the individual MTJs 306A and 306B, as depicted in FIG. 3C.

Figure 3D:
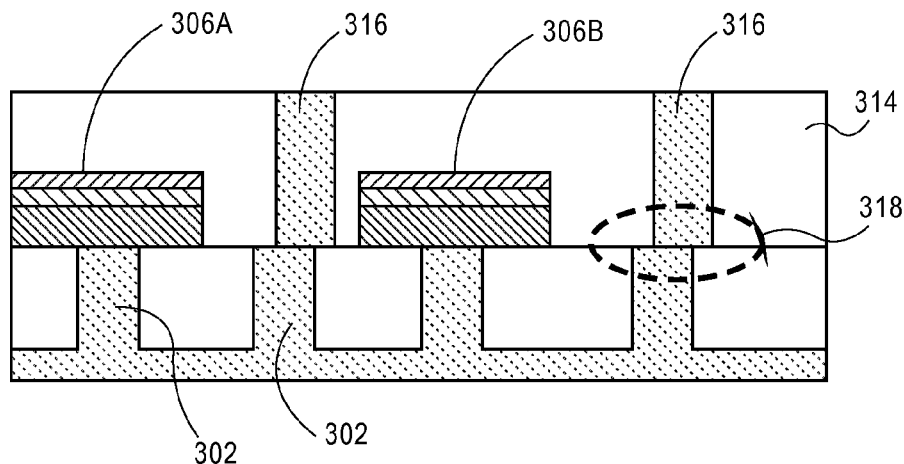
Figure 3E:
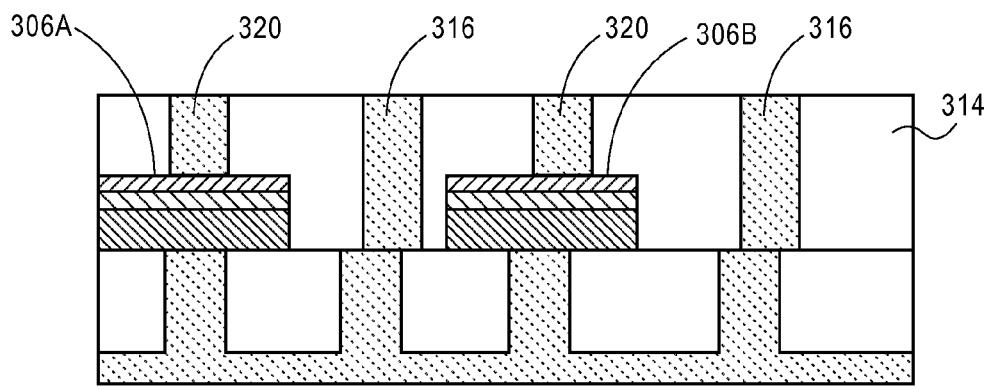
Figure 3F:
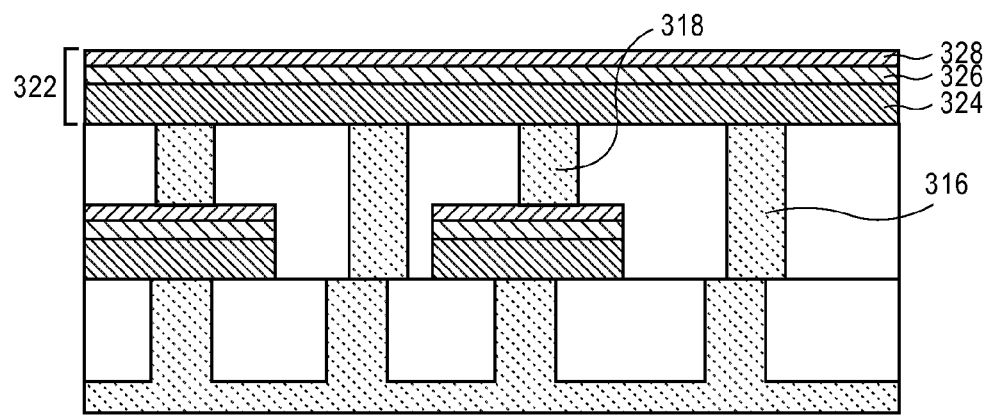
Figure 3G:
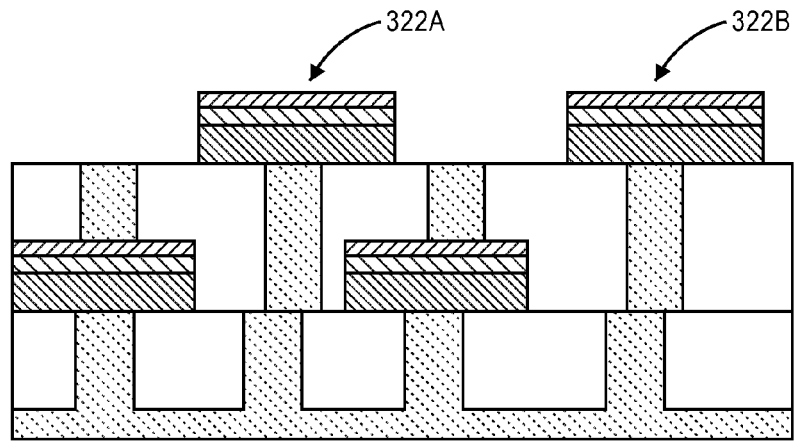
Figure 3H:
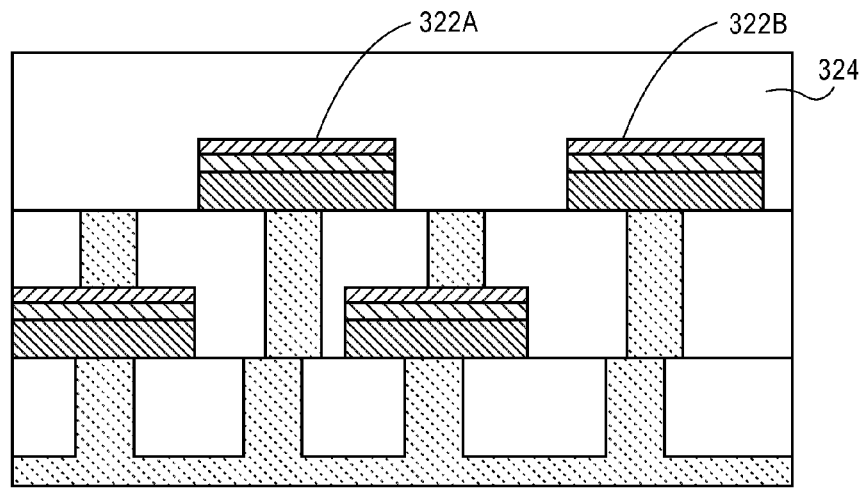
Figure 3I:
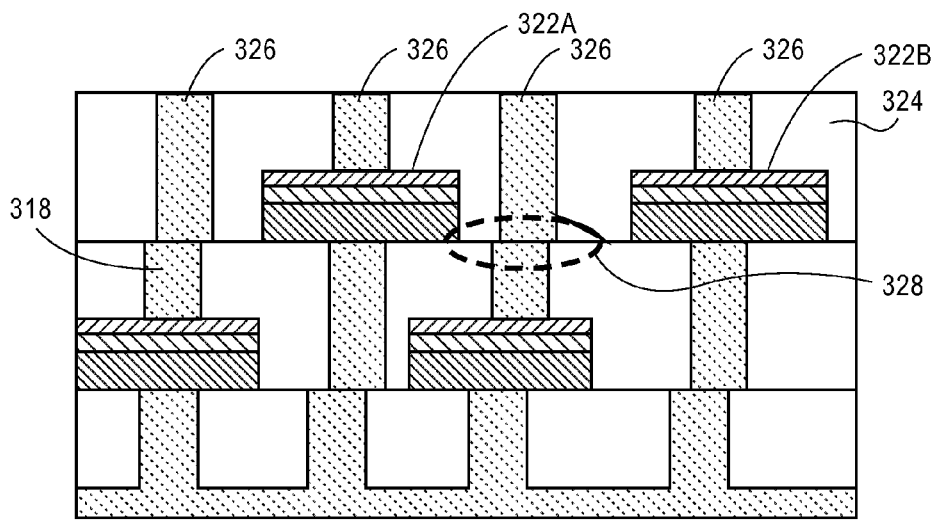

Referring to FIG. 3D, via extensions 316 are formed in inter-layer dielectric layer 314 to couple to every other load line of the plurality of load lines 302. It is to be understood that since the ultimate load lines between individual MTJs 306A and 306B are thus formed in two different patterning operations, misalignment may occur, e.g., at region 318. Additional vias 320 may then be formed in inter-layer dielectric layer 314, alternating with via extensions 316 and coupled to individual MTJs 306A and 306B, as depicted in FIG. 3E. Referring to FIG. 3F, a second material stack 322 for forming MTJs is formed on the via extensions 316 and vias 320. The second material stack 322 includes a fixed magnetic layer 324, a tunnel oxide layer 326 and a free magnetic layer 328. Referring to FIG. 3G, the material stack 322 is patterned (e.g., by lithography and etch processing) to provide individual MTJs 322A and 322B. An additional inter-layer dielectric layer 324 is formed on the individual MTJs 322A and 322B, as depicted in FIG. 3H. Referring to FIG. 3I, via extensions 326 are formed in inter-layer dielectric layer 324 to couple to the individual MTJs 322A and 322B or the vias 318. It is to be understood that since the ultimate load lines above individual MTJs 306A and 306B are thus formed in two different patterning operations, misalignment may occur, e.g., at region 328.

Figure 4A:
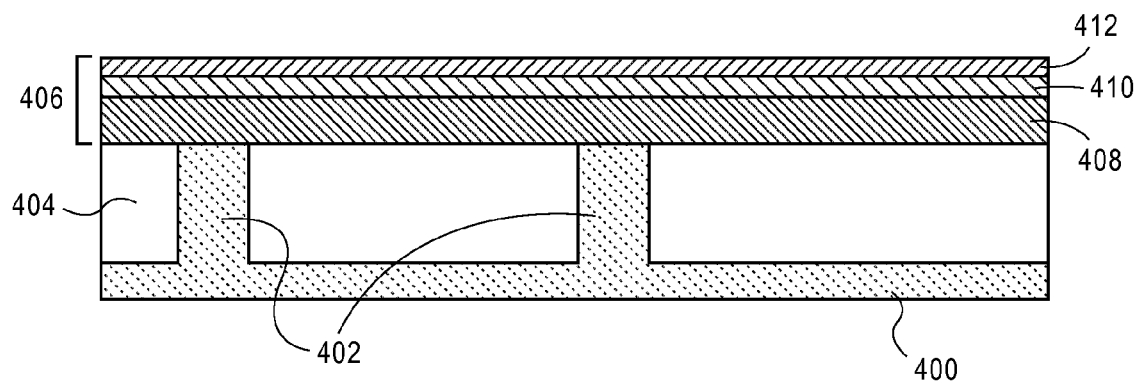
FIGS. 4A-4H illustrate cross-sectional views of various operations in another method of fabricating an array of perpendicular STTM devices, in accordance with another embodiment of the present invention.
Figure 4B:
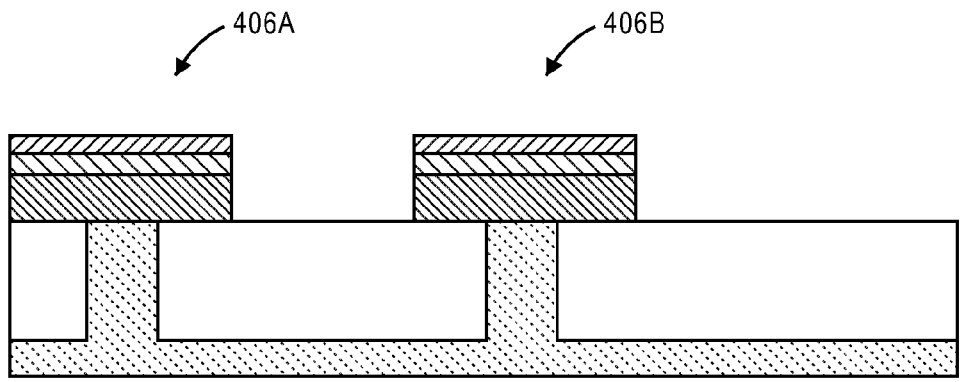
Figure 4C:
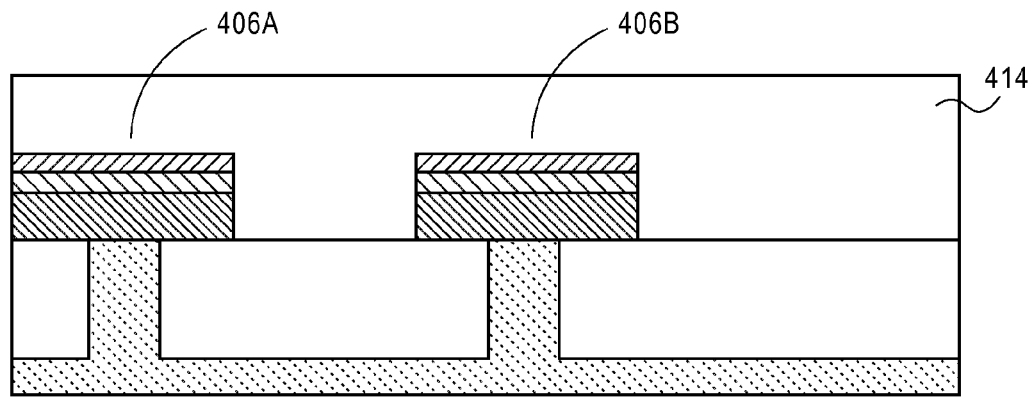
Figure 4D:
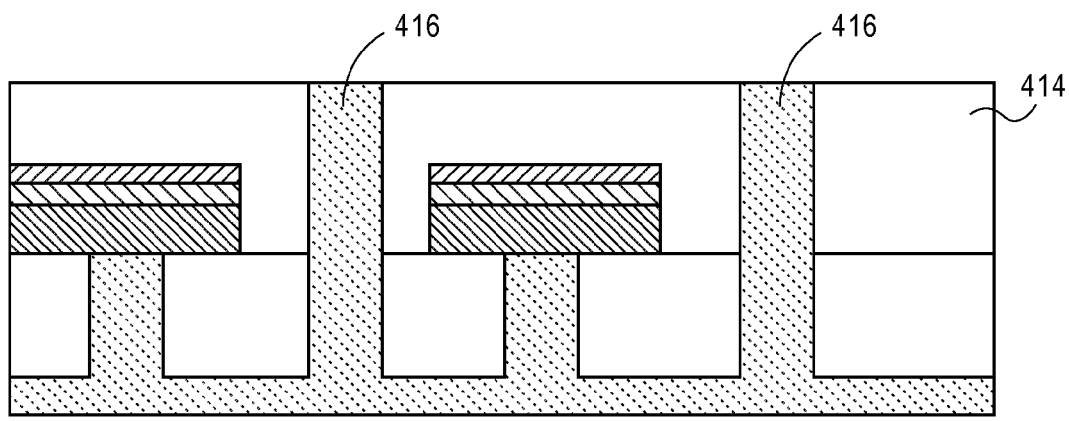
Figure 4E:
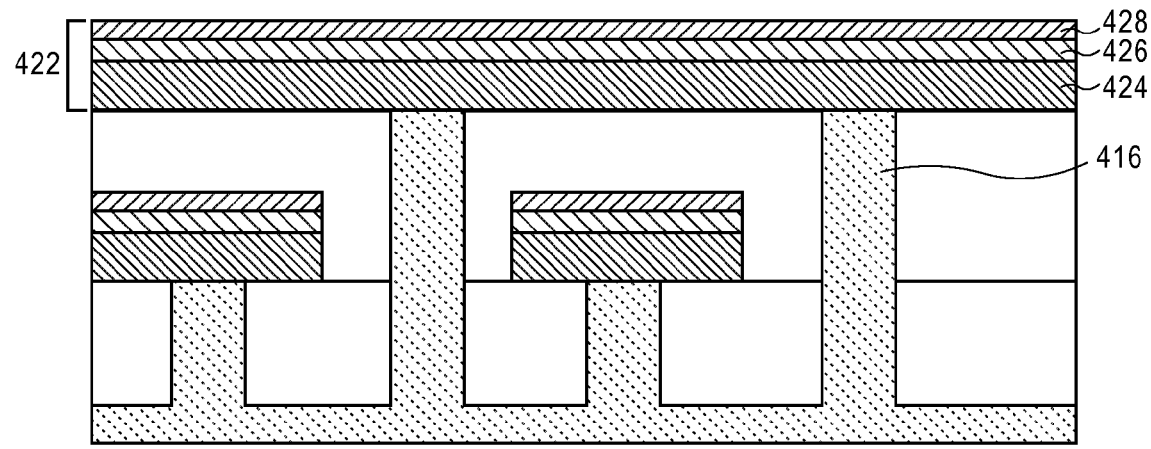
Figure 4F:
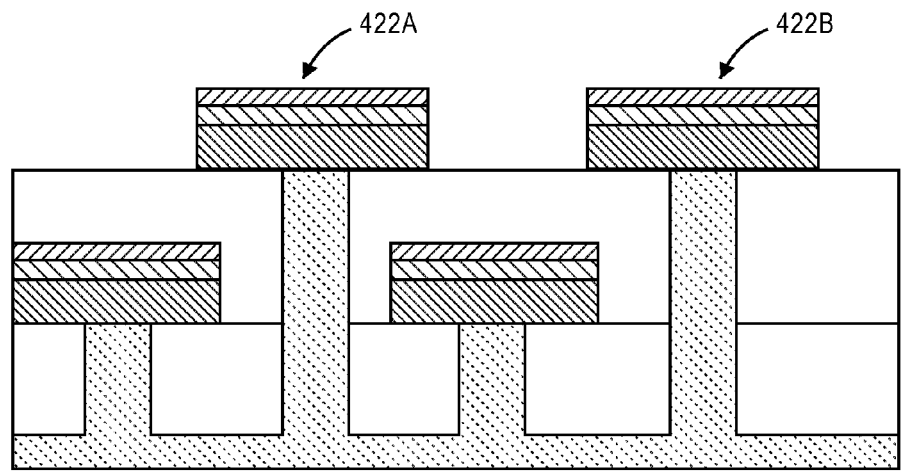
Figure 4G:
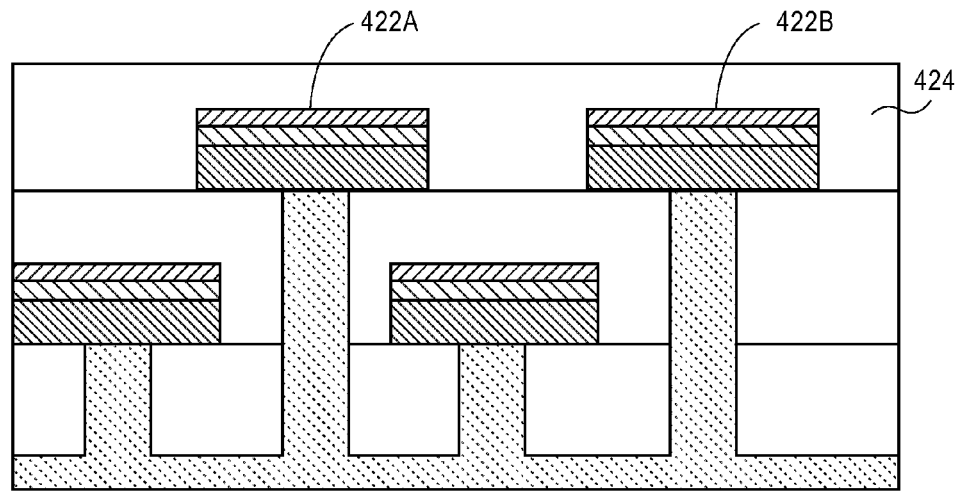
Figure 4H:
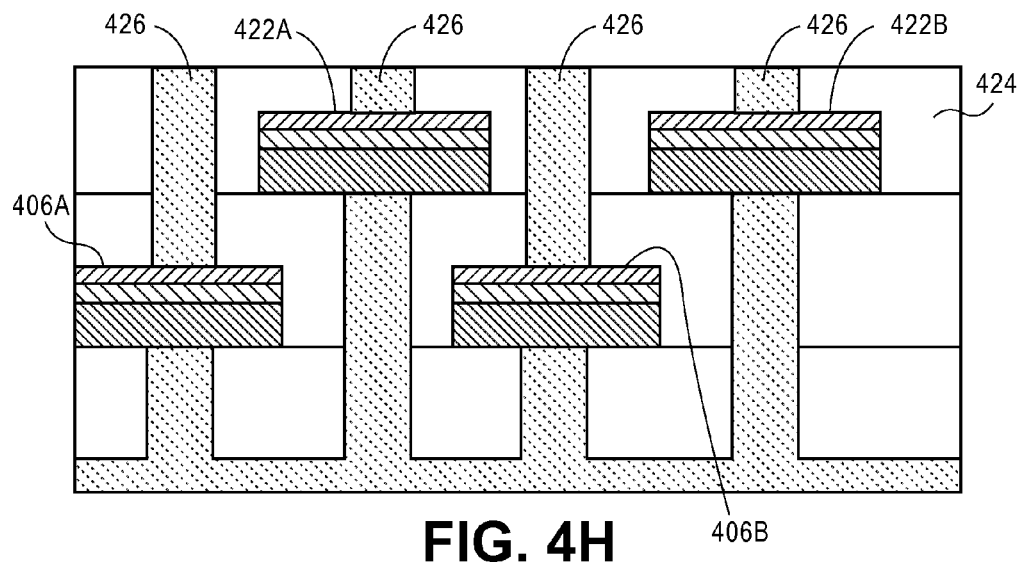

In a relaxed lithography approach, referring to FIG. 4A, a material stack 406 for forming magnetic tunnel junction (MTJ) includes a fixed magnetic layer 408, a tunnel oxide layer 410 and a free magnetic layer 412. The material stack 406 is formed above a plurality of load lines 402 formed above a bottom electrode 400 (which may be formed above a substrate, not shown; it is to be understood that although depicted as a common electrode for simplicity, it is to be understood that each device is coupled to its own corresponding transistor electrode to form a 1T-1STTM cell). An inter-dielectric layer 404 may be included between load lines 402, as depicted in FIG. 4A. Referring to FIG. 4B, the material stack 406 is patterned (e.g., by lithography and etch processing) to provide individual MTJs 406A and 406B. An additional inter-layer dielectric layer 414 is formed on the individual MTJs 406A and 406B, as depicted in FIG. 4C. Referring to FIG. 4D, additional load lines 416 are formed in inter-layer dielectric layers 414 and 404 to couple to the bottom electrode 400. Referring to FIG. 4E, a second material stack 422 for forming MTJs is formed on the load lines 416. The second material stack 422 includes a fixed magnetic layer 424, a tunnel oxide layer 426 and a free magnetic layer 428. Referring to FIG. 4F, the material stack 422 is patterned (e.g., by lithography and etch processing) to provide individual MTJs 422A and 422B. An additional inter-layer dielectric layer 424 is formed on the individual MTJs 422A and 422B, as depicted in FIG. 4G. Referring to FIG. 4H, vias 426 are formed in inter-layer dielectric layer 424 to couple to the individual MTJs 422A and 422B as well as the individual MTJs 406A and 406B.

It is to be understood that a staggered or offset array is to be distinguished from a class of memory cells based on multi-level memory. In multi-level memory, more than one device is situated on each load line. In an exemplary conventional implementation, two different vertically arranged magnetic junctions act as a single cell for a single load line, with 4 levels of resistance (0,0-0,1-0,1-1), rendering the arrangement a multi-level memory. Such a cell does not alleviate the fringing fields, however, since they are packed together densely. Most importantly, such a multi-level memory suffers from the difficulty of separating the 4 resistance levels (since the difference between the high and low of a single cell is not much greater than 2×). By contrast, embodiments described herein include only one device on each load line, with adjacent devices staggered from one another.

Furthermore, stability of each individual cell within an offset arrangement as described is an additional important issue facing scaling of STTM based devices and memory arrays fabricated there from. As scaling continues, the need for smaller memory elements to fit into a scaled cell size has driven the industry in the direction of perpendicular STTMs, which have higher stability for small memory element sizes. In an embodiment, individual perpendicular STTM cells for use in the above described offset arrangements are fabricated using interface tuning to derive a maximum amount of perpendicular strength and, hence, stability from a material stack that includes magnetic layers.

Figure 5:
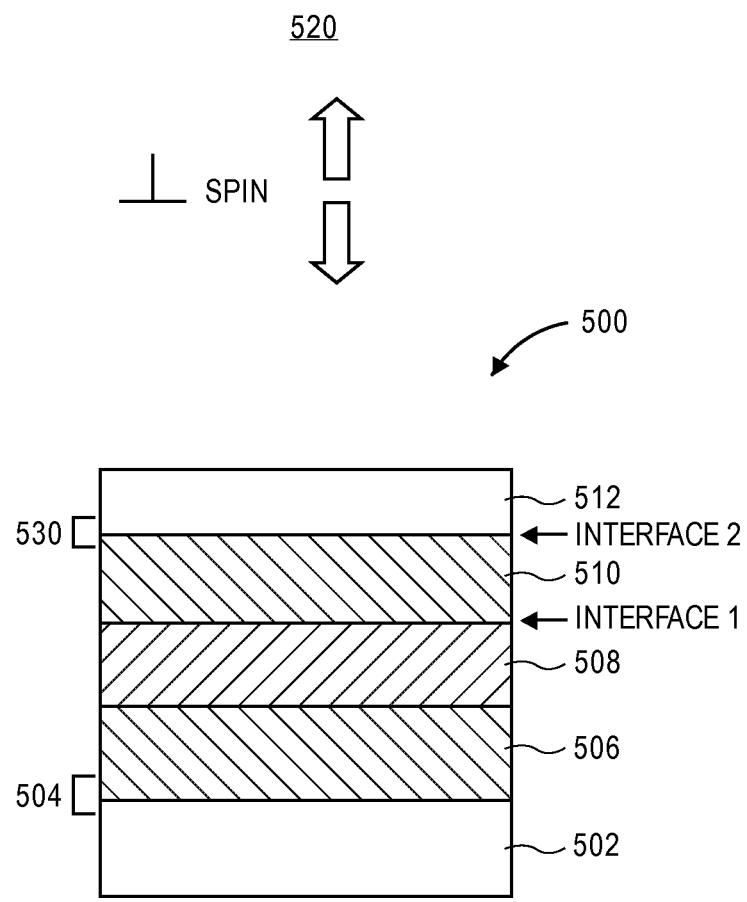
FIG. 5 illustrates a cross-sectional view of a material layer stack for a perpendicular spin transfer torque memory (STTM) device, in accordance with an embodiment of the present invention.

As a foundation for illustrating approaches to perpendicular stability within an offset array of perpendicular cells, FIG. 5 illustrates a cross-sectional view of a material layer stack for a perpendicular spin transfer torque memory (STTM) device, in accordance with an embodiment of the present invention. Referring to FIG. 5, a material layer stack 500 for a perpendicular STTM device includes a bottom electrode 502, a fixed magnetic layer 506, a dielectric layer 508, a free magnetic layer 510, and a top electrode 512. A magnetic tunnel junction (MTJ) portion of the material layer stack 500 includes the fixed magnetic layer 506, the dielectric layer 508, and the free magnetic layer 510. Material stack 500 is a basic material stack for fabricating perpendicular STTMs, and may be fabricated with greater complexity. For example, although not shown in the stack 500, an anti-ferromagnetic layer may also be included in position 504, i.e., between bottom electrode 502 and fixed magnetic layer 506. Additionally, electrodes 502 and 512 may themselves include multiple layers of material with differing properties. The material stack shown in FIG. 5 may, in its most basic form, be a perpendicular system, where spins of the magnetic layer 506 and 510 are perpendicular to the plane of the layers themselves, as illustrated by 520 in FIG. 5.

Without further engineering, the material stack 500 of FIG. 5 is typically an in-plane spin system. However, with layer or interface engineering, the material stack may be fabricated to provide a perpendicular spin system. In a first example, referring again to the features of material stack 500 as a platform, a free magnetic layer 510, e.g., a free magnetic layer composed of CoFeB, is thinned down from a conventional thickness used for in-plane STTM devices. The extent of thinning may be sufficient such that a perpendicular component obtained from the iron (Fe) in the layer 510 interacting with oxygen in the dielectric layer 508 (e.g., interacting with a magnesium oxide (MgO) layer 108 at interface 1 of FIG. 5) dominates over the in-plane component of the free CoFeB layer 510. This example provides a perpendicular system based on a single layer system of coupling to one interface of the free layer (i.e., the CoFeB—MgO interface). The degree of oxidation of surface iron atoms (Fe) in the CoFeB layer by oxygen from the MgO layer provides the strength (stability) of the free layer to have perpendicular-dominated spin states. In this example, electrodes 502 and 512 are composed of a single metal such as tantalum (Ta).

In a second example, referring again to the features of material stack 500 as a platform, top electrode 512 is replaced with a multi-layer stack electrode of alternating magnetic (e.g., cobalt (Co)) and non-magnetic layers (e.g., palladium (Pd)). Such a multi-layer scheme provides that each magnetic thin film layer (Co) has an interface which is perpendicular in spin direction. The final (bottom) Co layer in this stack, e.g., the Co layer that is on free layer 510 and forms interface 2, couples magnetically to the underlying CoFeB free layer 510.

The sum of all the interfaces (starting with interface 2) in the electrode 512 having alternating magnetic and non-magnetic layers in the full free layer and, possibly, in addition to interface 1, renders stability for the material of the free layer 510 to be perpendicular. That is, for this second example, stability drivers for a perpendicular spin device include a combination of the MgO coupling of the first example (i.e., from interface 1) as previously described, plus additional coupling interface 2 of the free layer 510 to an upper perpendicular magnet.

In a third example, referring again to the features of material stack 500 as a platform, a structure similar to the first example is provided. However, an additional tunneling barrier filter layer (e.g., a second MgO layer) is added to the stack at position 530, shown in FIG. 5. The inclusion of a second MgO layer allows oxygen from such a top MgO layer to interact with (e.g., oxidize) the Fe in at the top of the CoFeB free layer 510, practically doubling the stability of the cell over the first example. However, as attractive as this approach is, there may be a trade-off with the addition of a second MgO layer in the stack 500. Namely, such a second MgO layer is in reality a thin dielectric film which can increase the resistance of the resulting stack considerably. The resistance may increase to the point that it interferes with the ability to detect the difference between a '1' state and a '0' state, the detecting described in greater detail below.

Referring again to FIG. 5, in an embodiment, the fixed magnetic layer 506 is composed of a material or stack of materials suitable for maintaining a fixed majority spin. Thus, the fixed magnetic layer 506 (or reference layer) may be referred to as a ferromagnetic layer. In one embodiment, the fixed magnetic layer 506 is composed of a single layer of cobalt iron boride (CoFeB). However, in another embodiment, the fixed magnetic layer 506 is composed of a cobalt iron boride (CoFeB) layer, ruthenium (Ru) layer, cobalt iron boride (CoFeB) layer stack. In a specific such embodiment, the fixed magnetic layer is in the form of a synthetic antiferromagnet (SAF). From a top down perspective, the stack is a CoFeB/Ru/CoFe stack (e.g., no boron in the bottom layer, but there may be in other embodiments). It is to be understood that Ru thickness is very specific, e.g., 8-9 Angstroms such that the coupling between the CoFeB and the CoFe is anti-ferromagnetic; they point in opposite directions.

Referring again to FIG. 5, in an embodiment, the dielectric layer 508 is composed of a material suitable for allowing current of a majority spin to pass through the layer, while impeding at least to some extent current of a minority spin to pass through the layer. Thus, the dielectric layer 508 (or spin filter layer) may be referred to as a tunneling layer. In one embodiment, the dielectric layer 508 is composed of a material such as, but not limited to, magnesium oxide (MgO) or aluminum oxide ($Al_2O_3$). In one embodiment, the dielectric layer 508 has a thickness of approximately 1 nanometer.

Referring again to FIG. 5, in an embodiment, the free magnetic layer 510 is composed of a material suitable for transitioning between a majority spin and a minority spin, depending on the application. Thus, the free magnetic layer 510 (or memory layer) may be referred to as a ferromagnetic memory layer. In one embodiment, the free magnetic layer 510 is composed of a layer of cobalt iron (CoFe) or cobalt iron boride (CoFeB).

Referring again to FIG. 5, in an embodiment, the bottom electrode 502 is composed of a material or stack of materials suitable for electrically contacting the fixed magnetic layer side of a STTM device. In an embodiment, the bottom electrode 502 is a topographically smooth electrode. In one such embodiment, the bottom electrode 502 has a thickness suitable for good conductivity but has little to no columnar structure formation that would otherwise lead to a rough top surface. Such a topographically smooth electrode may be referred to as amorphous in structure. In a specific embodiment, the bottom electrode is composed of Ru layers interleaved with Ta layers. Effectively, in accordance with an embodiment of the present invention, the bottom electrode 502 may not be a conventional thick single metal electrode, such as a Ru electrode, but is instead a Ru/Ta interleaved materials stack. In alternative embodiments, however, the bottom electrode 502 is a conventional thick single metal electrode, such as a Ru electrode.

In an embodiment, the top electrode 512 is composed of a material or stack of materials suitable for electrically contacting the free magnetic layer side of a STTM device. In one embodiment, the top electrode 512 is composed of a ruthenium (Ru) layer and contact metal layer stack. The ruthenium layer may be included to prevent oxygen migration into the free magnetic layer 510. The metal contact layer may provide a low resistance path for conduction of current, and may be composed of material such as, but not limited to, copper, aluminum, nickel, and cobalt. In another embodiment, the top electrode 512 may be composed of essentially the same material stack as bottom electrode 502, e.g., as an interleaved and amorphous, thick, conductive stack.

Referring again to FIG. 5, in an embodiment, if included, the anti-ferromagnetic layer 504 is composed of a material suitable to facilitate locking of the spins in an adjacent fixed magnetic layer, such as fixed magnetic layer 506. In one embodiment, the anti-ferromagnetic layer 504 is composed of a material such as, but not limited to, iridium manganese (IrMn) or platinum manganese (PtMn).

In an embodiment, as described in additional detail later in association with FIG. 6, a non-volatile memory device includes a first electrode and a fixed magnetic layer disposed above the first electrode. A free magnetic layer is disposed above the fixed magnetic layer, and a second electrode is disposed above the free magnetic layer. A dielectric layer is disposed between the free magnetic layer and the fixed magnetic layer. The second electrode is adjacent the free magnetic layer. The non-volatile memory device also includes a transistor electrically connected to the free magnetic layer electrode, a source line, and a word line. In one embodiment, the non-volatile memory device further includes an anti-ferromagnetic layer disposed between the fixed magnetic layer and the first electrode.

In certain aspects and at least some embodiments of the present invention, certain terms hold certain definable meanings. For example, a "free" magnetic layer is a magnetic layer storing a computational variable. A "fixed" magnetic layer is a magnetic layer with permanent magnetization. A tunneling barrier, such as a tunneling dielectric or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the tunneling magneto-resistance effect while applying voltage to the output electrodes. In an embodiment, the role of the dielectric layer 508 is to cause a large magneto-resistance ratio. The magneto-resistance is the ratio of the difference between resistances when the two ferromagnetic layers have anti-parallel and parallel magnetization and the resistance of the state with the parallel magnetization.

Referring again to FIG. 5, the portion of the spin transfer torque element 500 including the free magnetic layer 510, the tunneling barrier layer 508, and the fixed magnetic layer 506 is known as a magnetic tunneling junction. The free magnetic layer 510 and the fixed magnetic layer 506 may be ferromagnetic layers which are able to hold a magnetic field or polarization. However, the fixed magnetic layer 506 is configured to hold the majority spin state (e.g., depicted as spin up for a perpendicular spin state). The tunneling barrier layer 508, which separates the free magnetic layer 510 and the fixed magnetic layer 506, may have a thickness, e.g. a distance between the free magnetic layer 510 and the fixed magnetic layer 506 of about 1 nanometer or less, such that electrons can tunnel there through, if a bias voltage is applied between the free magnetic layer electrode 512 and the fixed magnetic layer electrode 502.

In an embodiment, the MTJ functions essentially as a resistor, where the resistance of an electrical path through the MTJ may exist in two resistive states, either "high" or "low," depending on the relative directions or orientations of magnetization in the free magnetic layer 510 and in the fixed magnetic layer 506. Referring to FIG. 5, in the case that the spin direction is to the down (minority) in the free magnetic layer 510, a high resistive state exists, wherein direction of magnetization in the free magnetic layer 510 and the fixed magnetic layer 506 are substantially opposed or anti-parallel with one another. Referring again to FIG. 5, in the case that the spin direction is up (majority) in the free magnetic layer 510, a low resistive state exists, wherein the direction of magnetization in the free magnetic layer 510 and the fixed magnetic layer 506 is substantially aligned or parallel with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the free magnetic layer 510 may be switched through a process call spin transfer torque ("STT") using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layer 506. The electrons of the spin polarized current from the fixed magnetic layer 506 tunnel through the tunneling barrier or dielectric layer 508 and transfers its spin angular momentum to the free magnetic layer 510, wherein the free magnetic layer 510 will orient its magnetic direction from anti-parallel to that of the fixed magnetic layer 506 or parallel. The free magnetic layer 510 may be returned to its original orientation by reversing the current.

Thus, the MTJ may store a single bit of information ("0" or "1") by its state of magnetization. The information stored in the MTJ is sensed by driving a current through the MTJ. The free magnetic layer 510 does not require power to retain its magnetic orientations. As such, the state of the MTJ is preserved when power to the device is removed. Therefore, a spin transfer torque memory bit cell composed of the stack 500 of FIG. 5 is, in an embodiment, non-volatile.

Although the method of fabricating the stack of layers 500 for, e.g., a spin transfer torque memory bit cell has not been described complete detail herein, it is understood that the steps for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

In accordance with another embodiment of the present invention, one of the fixed magnetic layer 506, the free magnetic layer 510, or both, includes a half-metal material layer. In a first example, in one embodiment, a half-metal material layer is included at the fixed magnetic layer 506 and dielectric layer 508 interface. In a specific such embodiment, the fixed magnetic layer 506 is a single layer composed of the half-metal material. However, in another specific embodiment, only a portion of the fixed magnetic layer 506 is composed of the half-metal material. In a second example, in another embodiment, a half-metal material layer is included at the free magnetic layer 510 and dielectric layer 508 interface. In a specific such embodiment, the free magnetic layer 510 is a single layer composed of the half-metal material. However, in another specific embodiment, only a portion of the free magnetic layer 510 is composed of the half-metal material, e.g., as a sub-layer at the interface with the dielectric layer 508. In a third example, in yet another embodiment, a first half-metal material layer is included at the fixed magnetic layer 506 and dielectric layer 508 interface and a second half-metal material layer is included at the free magnetic layer 510 and dielectric layer 508 interface. In an embodiment, half-metals (e.g. Heusler alloys) are included to increase the difference between anti-parallel resistance (RAP) and parallel resistance (RP) (i.e. $\Delta R$) in magnetic tunneling junction (MTJ) devices.

In an embodiment, the half-metal material layers described above are referred to as a Heusler alloy, which is a ferromagnetic metal alloy based on a Heusler phase. Heusler phases may be intermetallics with particular composition and face-centered cubic crystal structure. The materials are ferromagnetic, even though the constituting elements are not, as a result of the double-exchange mechanism between neighboring magnetic ions. The materials usually include manganese ions, which sit at the body centers of the cubic structure and carry most of the magnetic moment of the alloy. In a specific embodiment, the half-metal material layer included in either the fixed magnetic layer 506, the free magnetic layer 510, or both, are material layers such as, but not limited to, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2Val$, $Mn_2VGa$, or $Co_2FeGe$.

Referring again to the description associated with FIG. 5, a stack of layers including magnetic material layers, e.g., which are used in a magnetic tunneling junction, may be used to fabricate a memory bit cell. For example, FIG. 6 illustrates a schematic of a spin transfer torque memory bit cell 600 which includes a spin transfer torque element 610, in accordance with an embodiment of the present invention.

Figure 6:
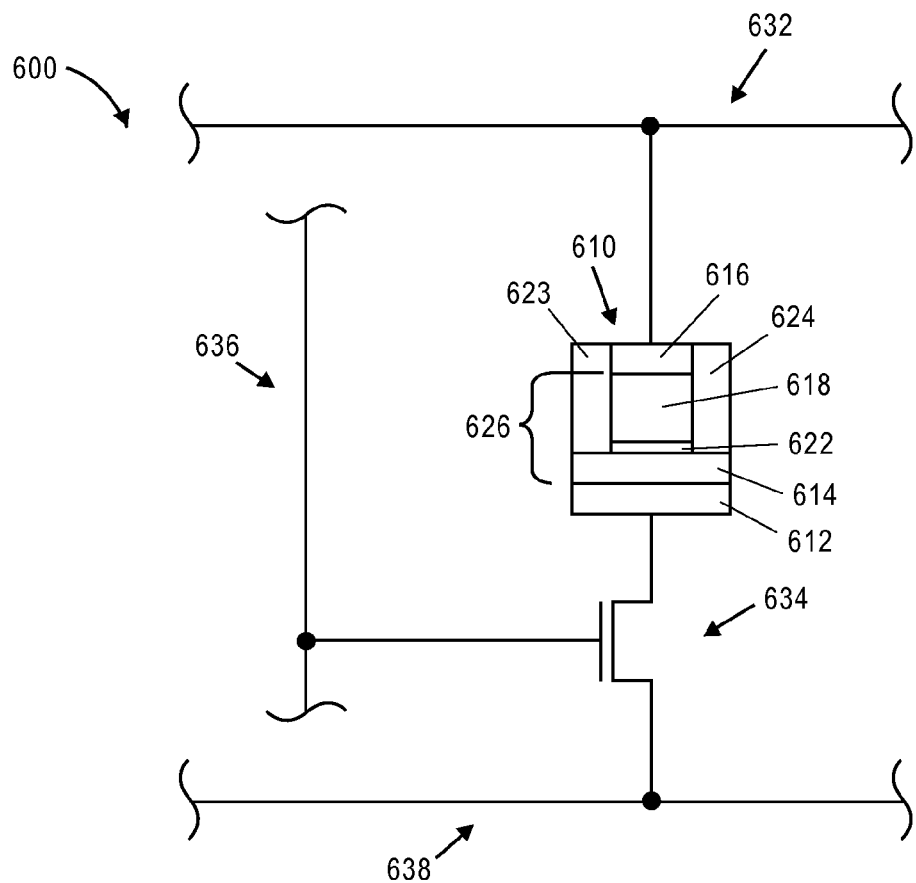
FIG. 6 illustrates a schematic of a spin transfer torque memory bit cell which includes a spin transfer torque element, in accordance with an embodiment of the present invention.

Referring to FIG. 6, the spin transfer torque element 610 may include a free magnetic layer electrode 612 with a free magnetic layer 614 adjacent the free magnetic layer electrode 612, a fixed magnetic layer electrode 616 adjacent a fixed magnetic layer 618, and a tunneling barrier or dielectric layer 622 disposed between the free magnetic layer 614 and the fixed magnetic layer 618. In an embodiment, the spin transfer torque element 610 is based on perpendicular magnetism.

A first dielectric element 623 and a second dielectric element 624 may be formed adjacent the fixed magnetic layer electrode 616, the fixed magnetic layer 618, and the tunneling barrier or dielectric layer 522. The fixed magnetic layer electrode 516 may be electrically connected to a bit line 632. The free magnetic layer electrode 612 may be coupled with a transistor 634. The transistor 634 may be coupled with a word line 636 and a source line 638 in a manner that will be understood to those skilled in the art. The spin transfer torque memory bit cell 600 may further include additional read and write circuitry (not shown), a sense amplifier (not shown), a bit line reference (not shown), and the like, as will be understood by those skilled in the art, for the operation of the spin transfer torque memory bit cell 600. It is to be understood that a plurality of the spin transfer torque memory bit cells 600 may be operably connected to one another to form a memory array (not shown), wherein the memory array can be incorporated into a non-volatile memory device. It is to be understood that the transistor 634 may be connected to the fixed magnetic layer electrode 616 or the free magnetic layer electrode 512, although only the latter is shown.

Figure 7:
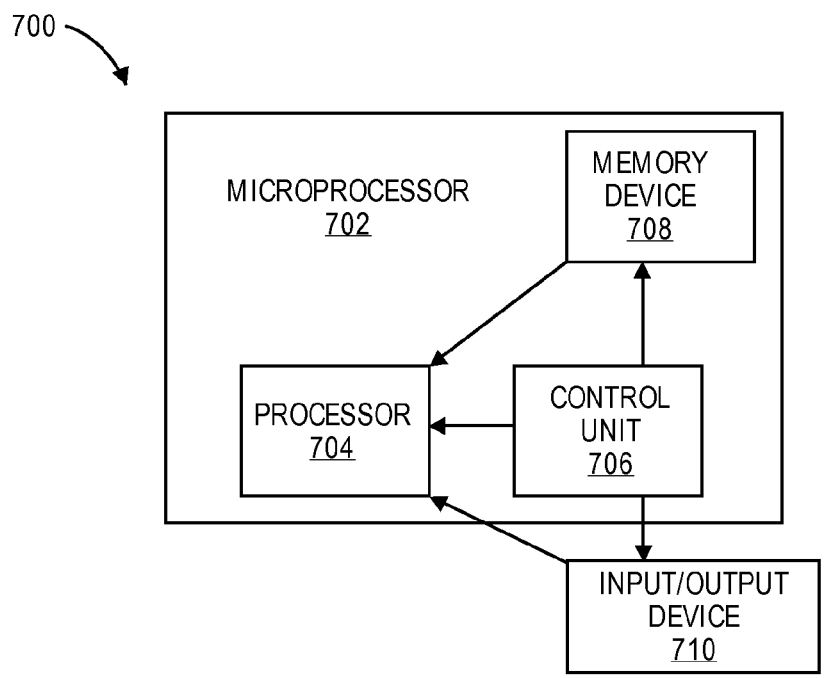
FIG. 7 illustrates a block diagram of an electronic system, in accordance with an embodiment of the present invention.

FIG. 7 illustrates a block diagram of an electronic system 700, in accordance with an embodiment of the present invention. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be understood that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a spin transfer torque element as described in the present description. In an embodiment, the memory device 708 is embedded in the microprocessor 702, as depicted in FIG. 7.

Figure 8:
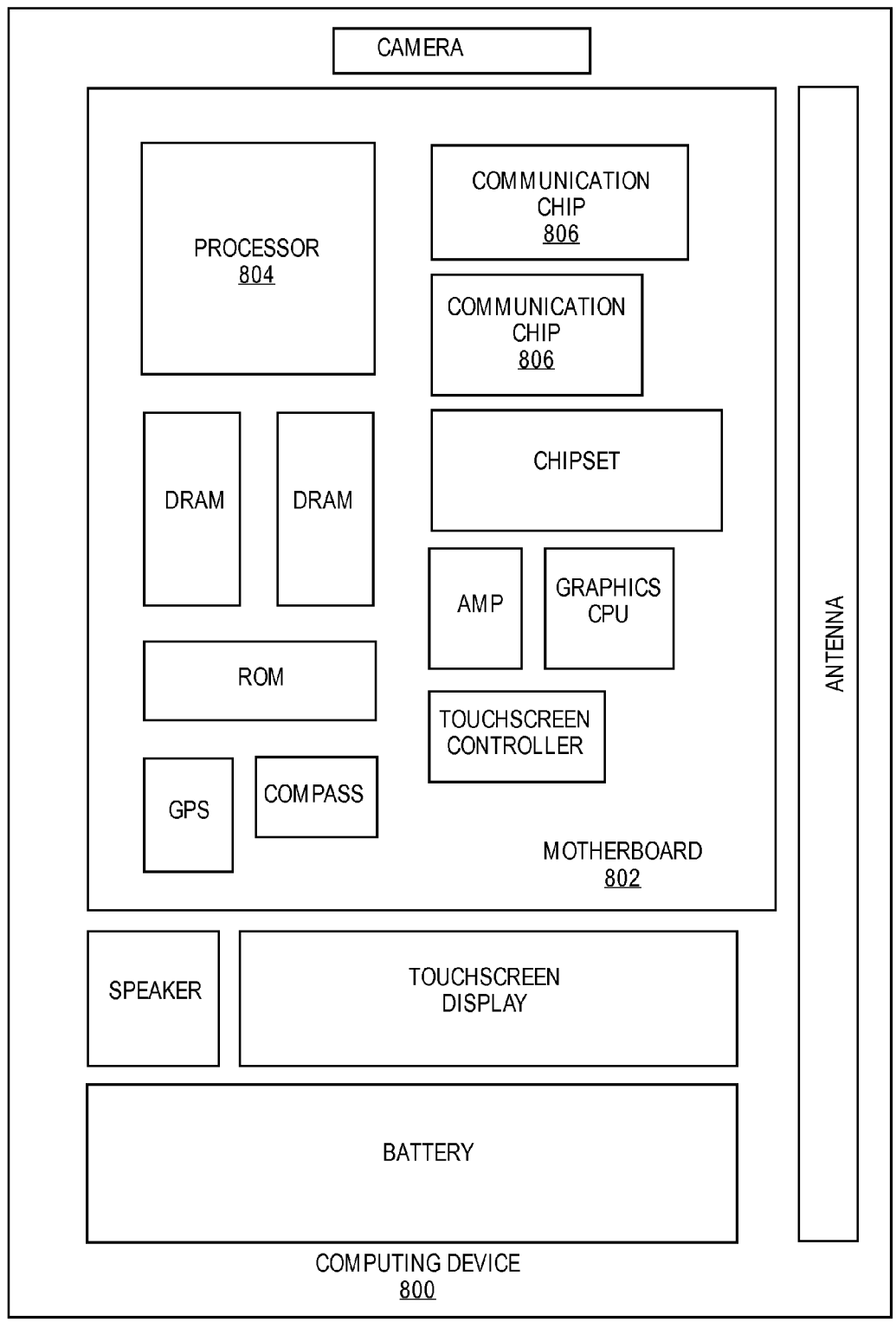
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as spin transfer torque memory built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as spin transfer torque memory built in accordance with implementations of the invention.

In further implementations, another component housed within the computing device 800 may contain an integrated circuit die that includes one or more devices, such as spin transfer torque memory built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Accordingly, one or more embodiments of the present invention relate generally to the fabrication of microelectronic memory. The microelectronic memory may be non-volatile, wherein the memory can retain stored information even when not powered. One or more, embodiments of the present invention relate to the fabrication of a perpendicular spin transfer torque memory element for non-volatile microelectronic memory devices. Such an element may be used in an embedded non-volatile memory, either for its non-volatility, or as a replacement for embedded dynamic random access memory (eDRAM). For example, such an element may be used for 1T-1X memory (X=capacitor or resistor) at competitive cell sizes within a given technology node.

Thus, embodiments of the present invention include perpendicular spin transfer torque memory (STTM) devices having offset cells and methods of fabricating perpendicular STTM devices having offset cells.

In an embodiment, a spin torque transfer memory (STTM) array includes a first load line disposed above a substrate and having only a first STTM device. The STTM array also includes a second load line disposed above the substrate, adjacent the first load line, and having only a second STTM device, the second STTM device non-co-planar with the first STTM device.

In one embodiment, the first and second STTM devices are perpendicular STTM devices.

In one embodiment, the first and second STTM devices are coupled by a fringing field, the fringing field a weak fringing field.

In one embodiment, the STTM array further includes a third load line disposed above the substrate, adjacent the second load line but not adjacent the first load line, and having only a third STTM device, the third STTM device non-co-planar with the second STTM device and co-planar with the first STTM device.

In one embodiment, the first and third STTM devices are coupled by a fringing field, the fringing field a weak fringing field.

In one embodiment, the STTM array further includes a fourth load line disposed above the substrate, adjacent the third load line but not adjacent the first or second load lines, and having only a fourth STTM device, the fourth STTM device non-co-planar with the third STTM device and co-planar with the second STTM device.

In one embodiment, the first, second, third, and fourth STTM devices are coupled to corresponding transistor contacts disposed above the substrate but below the first, second, third, and fourth STTM devices.

In one embodiment, each of the first and second STTM devices has a width, and the first and second STTM devices are laterally spaced from one another by an amount less than the width.

In one embodiment, the first and second STTM devices are offset by an amount greater than the width in a direction perpendicular to the substrate.

In one embodiment, each of the first and second STTM devices has a width of approximately 40 nanometers, and the first and second STTM devices are laterally spaced from one another by a distance of approximately 10 nanometers.

In one embodiment, the first and second STTM devices are offset by an amount of approximately 100 nanometers in a direction perpendicular to the substrate.

In one embodiment, each of the first and third STTM devices has a width of approximately 40 nanometers, and the first and third STTM devices are laterally spaced from one another by a distance of approximately 60 nanometers.

In one embodiment, each STTM device includes a free magnetic layer including iron (Fe) atoms, and includes a dielectric layer composed of magnesium oxide (MgO) below the free magnetic layer. At least a portion of the Fe atoms at an interface between the dielectric layer and the free magnetic layer are oxidized, and the interface between the dielectric layer and the free magnetic layer provides a perpendicular magnetic component for the STTM device.

In one embodiment, each STTM device further includes one or more pairs of alternating magnetic and non-magnetic layers disposed above the free magnetic layer, and an interface between the free magnetic layer and the pairs of alternating magnetic and non-magnetic layers provides a second perpendicular magnetic component for the STTM device.

In an embodiment, a method of fabricating a spin torque transfer memory (STTM) array includes forming a plurality of load line lower portions in a dielectric layer disposed above a substrate, each of the load line lower portions coupled to a corresponding transistor contact. The method also includes forming a first plurality of STTM devices, one device for each of alternating ones of the plurality of load line lower portions.

The method also includes forming a plurality of load line upper portions, one upper portion for each of the remaining ones of the plurality of load line lower portions, each load line upper portion adjacent a device of the first plurality of STTM devices. The method also includes forming a second plurality of STTM devices, one device for each of the load line upper portions, the devices of the second plurality of STTM devices non-co-planar with the devices of the first plurality of STTM devices.

In one embodiment, the method further includes forming a plurality of vias above the first and second pluralities of STTM devices, one via for each of the devices of the first and second pluralities of STTM devices.

In one embodiment, forming the first and second pluralities of STTM devices involves forming perpendicular STTM devices.

In one embodiment, a pair of devices of the first plurality of STTM devices is coupled by a fringing field, the fringing field a weak fringing field.

In one embodiment, a device of the first plurality of STTM devices and a device of the second plurality of STTM devices are coupled by a fringing field, the fringing field a weak fringing field.

In an embodiment, a method of fabricating a spin torque transfer memory (STTM) array includes forming a plurality of load line lower portions in a dielectric layer disposed above a substrate, each of the load line lower portions coupled to a corresponding transistor contact. The method also includes forming a first plurality of STTM devices, one device for each of the plurality of load line lower portions. The method also includes forming a plurality of load lines coupled to the corresponding transistor contacts, each load line adjacent a device of the first plurality of STTM devices. The method also includes forming a second plurality of STTM devices, one device for each of the load lines, the devices of the second plurality of STTM devices non-co-planar with the devices of the first plurality of STTM devices.

In one embodiment, the method further includes forming a plurality of vias above the first and second pluralities of STTM devices, one via for each of the devices of the first and second pluralities of STTM devices.

In one embodiment, forming the first and second pluralities of STTM devices involves forming perpendicular STTM devices.

In one embodiment, a pair of devices of the first plurality of STTM devices is coupled by a fringing field, the fringing field a weak fringing field.

In one embodiment, a device of the first plurality of STTM devices and a device of the second plurality of STTM devices are coupled by a fringing field, the fringing field a weak fringing field.

In an embodiment, a method of fabricating non-self-aligned vias includes forming a first plurality of vias, forming a first plurality of STTM devices above the first plurality of vias, depositing a dielectric layer, forming a second plurality of vias contacting the first plurality of STTM devices, forming a third plurality of vias contacting the first plurality of vias between the first plurality of STTM devices, forming a second plurality of STTM devices contacting the third plurality of vias, depositing a second dielectric layer, forming a fourth plurality of vias contacting the second plurality of STTM devices, and forming a fifth plurality of vias contacting the second plurality of vias.

In an embodiment, a method of fabricating self-aligned vias includes forming a first plurality of vias, forming a first plurality of STTM devices above the first plurality of STTM devices, depositing a dielectric layer, forming a second plurality of vias, contacting the first plurality of STTM devices, forming a third plurality of vias contacting a load line between the first plurality of STTM devices, forming a second plurality of STTM devices contacting the third plurality of vias, depositing a second dielectric layer, forming a fourth plurality of vias contacting the first plurality of STTM devices, and forming a fifth plurality of vias contacting the second plurality of STTM devices.

What is claimed is:

1. A spin torque transfer memory (STTM) array, comprising:
   a first load line disposed above a substrate and having only a first STTM device;
   a second load line disposed above the substrate, adjacent the first load line, and having only a second STTM device, the second STTM device non-co-planar with the first STTM device;
   a third load line disposed above the substrate, adjacent the second load line but not adjacent the first load line, and having only a third STTM device, the third STTM device non-co-planar with the second STTM device and co-planar with the first STTM device, wherein the first and third STTM devices are coupled by a fringing field, the fringing field a weak fringing field.

2. The STTM array of claim 1, wherein the first and second STTM devices are perpendicular STTM devices.

3. The STTM array of claim 1, wherein the first and second STTM devices are coupled by a fringing field, the fringing field a weak fringing field.

4. The STTM array of claim 1, further comprising:
   a fourth load line disposed above the substrate, adjacent the third load line but not adjacent the first or second load lines, and having only a fourth STTM device, the fourth STTM device non-co-planar with the third STTM device and co-planar with the second STTM device.

5. The STTM array of claim 4, wherein the first, second, third, and fourth STTM devices are coupled to a corresponding transistor contact disposed above the substrate but below the first, second, third, and fourth STTM devices.

6. The STTM array of claim 1, wherein each of the first and second STTM devices has a width, and the first and second STTM devices are laterally spaced from one another by an amount less than the width.

7. The STTM array of claim 6, wherein the first and second STTM devices are offset by an amount greater than the width in a direction perpendicular to the substrate.

8. The STTM array of claim 1, wherein each of the first and second STTM devices has a width of approximately 40 nanometers, and the first and second STTM devices are laterally spaced from one another by a distance of approximately 10 nanometers.

9. The STTM array of claim 8, wherein the first and second STTM devices are offset by an amount of approximately 100 nanometers in a direction perpendicular to the substrate.

10. The STTM array of claim 1, wherein each of the first and third STTM devices has a width of approximately 40 nanometers, and the first and third STTM devices are laterally spaced from one another by a distance of approximately 60 nanometers.

11. The STTM array of claim 1, wherein each STTM device includes a free magnetic layer comprising iron (Fe) atoms, and includes a dielectric layer comprising magnesium oxide (MgO) below the free magnetic layer, wherein at least a portion of the Fe atoms at an interface between the dielectric layer and the free magnetic layer are oxidized, and the interface between the dielectric layer and the free magnetic layer provides a perpendicular magnetic component for the STTM device.

12. The STTM array of claim 11, wherein each STTM device further comprises one or more pairs of alternating magnetic and non-magnetic layers disposed above the free magnetic layer, and wherein an interface between the free magnetic layer and the pairs of alternating magnetic and non-magnetic layers provides a second perpendicular magnetic component for the STTM device.

13. A spin torque transfer memory (STTM) array, comprising:
   a first load line disposed above a substrate and having only a first STTM device; and
   a second load line disposed above the substrate, adjacent the first load line, and having only a second STTM device, the second STTM device non-co-planar with the first STTM device, wherein each of the first and second STTM devices has a width, and the first and second STTM devices are laterally spaced from one another by an amount less than the width, and wherein the first and second STTM devices are offset by an amount greater than the width in a direction perpendicular to the substrate.

14. The STTM array of claim 13, wherein the first and second STTM devices are perpendicular STTM devices.

15. The STTM array of claim 13, wherein the first and second STTM devices are coupled by a fringing field, the fringing field a weak fringing field.

16. The STTM array of claim 13, wherein each of the first and second STTM devices has a width of approximately 40 nanometers, and the first and second STTM devices are laterally spaced from one another by a distance of approximately 10 nanometers.

17. The STTM array of claim 16, wherein the first and second STTM devices are offset by an amount of approximately 100 nanometers in a direction perpendicular to the substrate.

18. The STTM array of claim 13, wherein each STTM device includes a free magnetic layer comprising iron (Fe) atoms, and includes a dielectric layer comprising magnesium oxide (MgO) below the free magnetic layer, wherein at least a portion of the Fe atoms at an interface between the dielectric layer and the free magnetic layer are oxidized, and the interface between the dielectric layer and the free magnetic layer provides a perpendicular magnetic component for the STTM device.

19. The STTM array of claim 18, wherein each STTM device further comprises one or more pairs of alternating magnetic and non-magnetic layers disposed above the free magnetic layer, and wherein an interface between the free magnetic layer and the pairs of alternating magnetic and non-magnetic layers provides a second perpendicular magnetic component for the STTM device.

20. A spin torque transfer memory (STTM) array, comprising:
   a first load line disposed above a substrate and having only a first STTM device; and
   a second load line disposed above the substrate, adjacent the first load line, and having only a second STTM device, the second STTM device non-co-planar with the first STTM device, wherein each of the first and second STTM devices has a width of approximately 40 nanometers, and the first and second STTM devices are laterally spaced from one another by a distance of approximately 10 nanometers, and wherein the first and second STTM devices are offset by an amount of approximately 100 nanometers in a direction perpendicular to the substrate.

21. The STTM array of claim 20, wherein the first and second STTM devices are perpendicular STTM devices.

22. The STTM array of claim 20, wherein the first and second STTM devices are coupled by a fringing field, the fringing field a weak fringing field.

23. The STTM array of claim 20, wherein each STTM device includes a free magnetic layer comprising iron (Fe) atoms, and includes a dielectric layer comprising magnesium oxide (MgO) below the free magnetic layer, wherein at least a portion of the Fe atoms at an interface between the dielectric layer and the free magnetic layer are oxidized, and the interface between the dielectric layer and the free magnetic layer provides a perpendicular magnetic component for the STTM device.

24. The STTM array of claim 23, wherein each STTM device further comprises one or more pairs of alternating magnetic and non-magnetic layers disposed above the free magnetic layer, and wherein an interface between the free magnetic layer and the pairs of alternating magnetic and non-magnetic layers provides a second perpendicular magnetic component for the STTM device.

25. A spin torque transfer memory (STTM) array, comprising:
a first load line disposed above a substrate and having only a first STTM device; and
a second load line disposed above the substrate, adjacent the first load line, and having only a second STTM device, the second STTM device non-co-planar with the first STTM device, wherein each STTM device includes a free magnetic layer comprising iron (Fe) atoms, and includes a dielectric layer comprising magnesium oxide (MgO) below the free magnetic layer, wherein at least a portion of the Fe atoms at an interface between the dielectric layer and the free magnetic layer are oxidized, and the interface between the dielectric layer and the free magnetic layer provides a perpendicular magnetic component for the STTM device.

26. The STTM array of claim 25, wherein the first and second STTM devices are perpendicular STTM devices.

27. The STTM array of claim 25, wherein the first and second STTM devices are coupled by a fringing field, the fringing field a weak fringing field.

28. The STTM array of claim 25, wherein each STTM device further comprises one or more pairs of alternating magnetic and non-magnetic layers disposed above the free magnetic layer, and wherein an interface between the free magnetic layer and the pairs of alternating magnetic and non-magnetic layers provides a second perpendicular magnetic component for the STTM device.

* * * * *